United States Patent
Schmidt et al.

(12) 
(10) Patent No.: US 6,232,631 B1
(45) Date of Patent: May 15, 2001

(54) FLOATING GATE MEMORY CELL STRUCTURE WITH PROGRAMMING MECHANISM OUTSIDE THE READ PATH

(75) Inventors: Christopher O. Schmidt, Sunnyvale; Sunil D. Mehta, San Jose, both of CA (US)

(73) Assignee: Vantis Corporation, Sunnyvale, CA (US)

(*) Notice: Subject to any disclaimer, the term of this patent is extended or adjusted under 35 U.S.C. 154(b) by 0 days.

(21) Appl. No.: 09/217,648

(22) Filed: Dec. 21, 1998

(51) Int. Cl.[7] .............................. H01L 29/788
(52) U.S. Cl. .......................... 257/315; 257/320
(58) Field of Search .................. 257/314, 315, 257/318, 319, 320, 321, 322; 438/201, 211, 257, 258, 296, 261; 365/185.01, 185.08, 185.14, 185.18, 185.26, 185.27

(56) References Cited

U.S. PATENT DOCUMENTS

| | | | |
|---|---|---|---|
| 4,037,242 | 7/1977 | Gosney | 365/185.08 |
| 4,885,719 | 12/1989 | Brahmbhatt | 365/181 |
| 4,924,278 | 5/1990 | Logie | 357/23.5 |
| 5,103,425 | 4/1992 | Kuo et al. | 365/185.23 |
| 5,366,915 | 11/1994 | Kodama | 438/257 |
| 5,491,657 | 2/1996 | Haddad et al. | 365/185.27 |
| 5,554,552 | 9/1996 | Chi | 438/264 |
| 5,587,945 | 12/1996 | Lin et al. | 365/185.1 |
| 5,615,150 | 3/1997 | Lin et al. | 365/185.17 |
| 5,640,346 | 6/1997 | Preslar | 365/185.1 |
| 5,646,901 | 7/1997 | Sharpe-Geisler et al. | 365/218 |
| 5,719,427 | 2/1998 | Tong et al. | 257/355 |
| 5,742,542 | 4/1998 | Lin et al. | 365/185.08 |
| 5,761,116 | 6/1998 | Li et al. | 365/185.1 |
| 5,783,457 | 7/1998 | Hsu | 438/302 |
| 5,854,114 | * 12/1998 | Li et al. | 438/296 |
| 5,912,488 | 6/1999 | Kim et al. | 257/316 |
| 5,969,992 | * 10/1999 | Mehta et al. | 365/185.28 |
| 6,037,224 | * 10/1999 | Buller et al. | 438/258 |

FOREIGN PATENT DOCUMENTS

| | | | |
|---|---|---|---|
| 0 295 935 A1 | 12/1988 | (EP) | G11C/17/00 |
| 0 354 457 | 2/1990 | (EP) . | |
| 0 714 133 | 5/1996 | (EP) . | |
| 0 776 049 | 5/1997 | (EP) . | |
| 0 865 045 | 9/1998 | (EP) . | |
| 2 022 922 | 12/1979 | (GB) . | |
| 60-053083 | 3/1985 | (JP) . | |
| 6-204492 | 7/1994 | (JP) . | |
| 10-074850 | 3/1998 | (JP) . | |
| 10-223782 | 8/1998 | (JP) . | |
| WO 93 18519 | 9/1993 | (WO) . | |
| WO 97/02605 | 1/1997 | (WO) | H01L/29/788 |

OTHER PUBLICATIONS

"Performance Limitations of a Flash E²PROM Cell, Programmed with Zener Induced Hot Electrons", by J. Ranaweera, I. Kalastirsky, A. Dibu–Caiole, W.T. Ng, and C.A.T. Salama, Proceedings of the 15th Annual Non–Volatile Semiconductor Memory Workshop, Paper #2.2 (1997).

\* cited by examiner

*Primary Examiner*—Olik Chaudhuri
*Assistant Examiner*—Hoai Pham
(74) *Attorney, Agent, or Firm*—Fliesler Dubb Meyer & Lovejoy LLP

(57) ABSTRACT

A non-volatile memory cell structure includes a floating gate, a reverse breakdown hot carrier injection element and a sense transistor. The reverse breakdown hot carrier injection element is at least partially formed in a first region of a semiconductor substrate under at least a portion of the floating gate. The sense transistor is at least partially formed in a second region of a semiconductor substrate, isolated from the first region, and under at least a portion of the floating gate. A read transistor may be connected to the sense transistor. In one embodiment, the read transistor is at least partially formed in the second region of a semiconductor substrate, and connected to the sense transistor.

34 Claims, 9 Drawing Sheets

| Operation | ACG | BL | WL | WC | FG |
|---|---|---|---|---|---|
| Erase (bulk) | 0V | 8V | 0V | HiZ | -ve |
| Program | 8V | 8V | 0V | HiZ | -ve+$\Delta V_p$ |
| Not progr. | 0V | 8V | 0V | HiZ | -ve-$\Delta_p$ |
| Not progr. | 8V | 3.3V | 0V | HiZ | -ve |
| Read | 3.3V | ground | 3.3V | 3.3V | -ve(or+$\Delta V_p$) |

$\Delta_p$ = Programming disturb; it should be less than 1V.

$\Delta V_p$ = It will be in 3-8V range depending on programming time. $\Delta V_p \cong 4V$ for $t_{prog} \cong 10\mu s$.

*Assumed that the junction breakdown voltage is at 7.5V or below so that 8V operation is sufficient for junction breakdown.

*FIG. 4B*
*(PRIOR ART)*

FLOATING GATE MEMORY CELL STRUCTURE WITH PROGRAMMING MECHANISM OUTSIDE THE READ PATH

BACKGROUND OF THE INVENTION

1. Field of the Invention

The invention relates to nonvolatile memory, and particularly a non-volatile memory structure optimized for particular applications such as programmable logic devices (PLD's).

2. Description of the Related Art

Non-volatile memory devices of the type commonly referred to in the art as EPROM, EEPROM, or Flash EEPROM serve a variety of purposes, and are hence provided in a variety of architectures and circuit structures.

As with many types of integrated circuit devices, some of the main objectives of non-volatile memory device designers are to increase the performance of devices, while decreasing device dimensions and consequently increasing circuit density. Cell designers strive for designs which are reliable, scalable, cost effective to manufacture and able to operate at lower power, in order for manufacturers to compete in the semiconductor industry. EEPROM devices are one such device that must meet these challenges. In some applications, such as flash memory cards, density is at a premium, while in applications such as programmable logic devices (PLD's), reliability and speed are more important and space is at less of a premium.

EEPROMS (electrically erasable/programmable read-only memories) generally employ Fowler-Nordheim (F-N) tunneling for both programming and erasing. The term "flash", when used with "EEPROM", generally refers to a device programmed by hot electron injection. Generally, flash technology employs a floating gate structure with a thin oxide layer between the floating gate and the drain side of the transistor where Fowler-Nordheim tunneling occurs.

As process technology progresses toward the so-called 0.18 and 0.13 micron processes, the conventional "stacked gate" EEPROM structure has given way to different cell designs and array architectures, all intended to increase density and reliability in the resulting circuit. In addition, designers are driven to reduce the power requirements of such devices. In non-volatile memory devices, the program and erase functions generally require much larger voltages than the read function requires. Consequently, designers are motivated to reduce programming and erase voltages for nonvolatile memory devices.

In the self-aligned, "stacked gate" cell, a high quality oxide is required, as well as a unique drain and source structure optimized for program and erase operations, respectively, and complementary adaptive program and erase algorithms. Typically, in the stacked gate EEPROM, in order to store a logical zero, electrons are injected onto the floating gate to provide a negative voltage on the floating gate thus increasing the control gate threshold voltage needed to turn on the transistor. Likewise, in order to erase the EEPROM, electrons are removed from the floating gate thereby decreasing the threshold voltage and a logical one is stored on the gate. While stacked gate embodiments have existed and worked well for some time, improved alternative cells have resulted in higher performance integrated circuit devices.

One example of an alternative to the stacked gate EEPROM structure is shown in U.S. Pat. No. 4,924,278, issued to Stewart Logie on May 8, 1990 and assigned to the assignee of the present invention. The EEPROM structure disclosed therein utilizes a single layer of polycrystalline silicon so as to eliminate the need to form a separate control gate and floating gate. The EEPROM structure shown therein is made up of three separate NMOS transistors: a write transistor, a read transistor, and a sense transistor. In order to "program" the floating gate, a net positive charge is placed on the gate by removing free electrons from the floating gate. Likewise, to erase the floating gate, the floating gate is given a net negative charge by injecting electrons onto the floating gate. This convention will be used in the final description of the present invention. This basic EEPROM structure has been well exploited in commercial devices. Nevertheless, as process technologies and practical considerations drive designers toward higher performance, alternative designs are investigated. For example, the aforementioned cell structure requires, in a number of embodiments, a minimum oxide thickness of about 90 Å for the program junction oxide region in order to prevent charge loss due to direct tunneling under to the presence of the high electric field across this region.

An alternative to the aforementioned FN tunneling-based cell structure is presented in Ranaweera, et al., "Performance Limitations of a Flash EEPROM Cell, Programmed With Zener Induced Hot Electrons," University of Toronto Department of Electrical Engineering (1997). Discussed therein is a flash EEPROM cell which accomplishes programming and erase by establishing a reverse breakdown condition at the drain/substrate junction, generating hot electrons which are then swept onto the floating gate to program the cell.

FIGS. 1A, 1B and 1C of Ranaweera, et al. are reproduced as FIGS. 1A, 1B and 1C of the present application. FIGS. 1B and 1C are cross-sections of the plan view of the cell shown in FIG. 1A. As shown in FIG. 1C, a "ZEEPROM" cell comprises a source and drain region, floating gate and control gate, with a P+ pocket implant extending part way across the width of the drain region to generate hot electrons for programming. The flash ZEEPROM cells are fabricated using CMOS compatible process technology, with the addition of a heavily doped boron implant for the P+ region replacing the LDD region. A sidewall spacer is necessary to form the self-aligned N+ source and drain regions and to avoid counter-doping of the P+ pocket.

To program the flash ZEEPROM cell, the P+ N+ junction is reverse-biased to create an electric field of approximately $10^6$ volt/cm. and generate energetic hot electrons independent of the channel length. The P+ region adjacent to the drain enhances this generation. A low junction breakdown voltage can be used for programming by optimizing the P+ N+ junction depth and profiles. One disadvantage of this cell is that a low drain voltage (approximately one volt) must be used to read the cell since the P+ region exhibits a low breakdown voltage which can contribute to "soft programming" due to unwanted charge injection to the gate (generally referred to herein as "program disturb"). Erasing in the cell described by Ranaweera is performed by Fowler-Nordheim tunneling of electrons from the floating gate to the source region using a negative gate voltage and positive supply voltage connected to the source similar to conventional flash EEPROM cells.

Another alternative cell structure using hot election programming generated by a reverse breakdown condition at the drain is described in the context of a method for bulk charging and discharging of an array of flash EEPROM memory cells in U.S. Pat. No. 5,491,657 issued to Haddad, et al., assigned to the assignee of the present invention. In Haddad, et al., a cell structure similar to that shown in cross-section in FIG. 1 B of the present application may be used, as well as a substrate-biased p-well in n-well embodiment. In the first embodiment, an N+ source region includes an N+ implant region and an N diffusion region, and the erase (in this case removing electrons) operation is accomplished by applying (−)8.5 volts to the control gate for 100 milliseconds, and (+)5 volts to the source for 100 milliseconds, with the drain being allowed to float. In contrast, programming (in this case adding electrons to the gate) is achieved by applying a negative 8.5 volt to the substrate for 5 microseconds, zero volts to the drain and control gate with the source floating. The bulk charging operation can just as easily be done on the source side rather than the drain side in a case where the cell is provided in a P well by applying −8.5 volts to the P well for 5 microseconds, 0 volts to the source and control gate with the drain being allowed to float.

Yet another structure and method for programming a cell is detailed in co-pending U.S. patent application Ser. No. 08/871,589, inventors Hao Fang, et al., filed Jul. 24, 1998 and assigned to the assignee of the present application. FIGS. 1A and 1B of the Fang, et al. application are reproduced herein as FIGS. 2A and 2B, and FIGS. 2A and 2B of the Fang application are reproduced as FIGS. 3A and 3B of the present application. The Fang, et al. application uses the programming method disclosed in Haddad, et al. to form a high density, low program/erase voltage and current, and fast byte programming and bulk erase and fast reading speed non-volatile memory structure specifically designed for programmable logic circuit applications.

In Fang, et al. the non-volatile memory cell 10 in FIG. 2A, 2B is formed of a P substrate 12 having embedded therein an N+ source region 14, an N-type diffused drain region 16, a floating gate 18 overlaying the P substrate 12 and separated from it by a tunnel oxide 20, or other gate dielectric such as nitride oxide; and a control gate 22 coupled capacitively to the floating gate 18 through an oxide/nitride/oxide, or other type of inter polysilicon dielectric, film 24,26. Diffused region 16 is formed of a shallowly diffused but heavily doped N-type junction, while source region 14 is formed of a deeply diffused but lightly doped N junction. The relatively thin gate dielectric 20 (an oxide of 60 to 150 Å in thickness) is interposed between top surface of substrate 12 and conductor polysilicon floating gate 18. Control gate 22 is supported above the floating gate by the inter-poly dielectric layer 24,26. Avalanche program and erase bias configurations of the memory cell of the Fang, et al. application are shown in FIGS. 3A and 3B, respectively.

Program and erase operations are illustrated in FIGS. 3A and 3B. To program the cell, electron injection is effected from the drain side. In this case, programming operation is accomplished by applying +3 volts on the drain and −6 volts on the P substrate so as to shift upwardly the threshold voltage $V_t$ by 4 volts in approximately 0.002 seconds. To erase, holes are injected from the drain side by applying +6.5 volts on the drain and −3 volts on the P substrate so as to shift downwardly the threshold voltage $V_t$ by 4 volts. Utilizing the substrate bias configuration suppresses hot hole injection due to the fact that the location of the high field is away from the oxide interface, the magnitude of the maximum field strength is reduced by more than 50%, and the vertical field does not favor hole injection.

FIGS. 4A and 4B show FIGS. 10A and 10B of the Fang, et al. application which teach a single polysilicon layer embodiment of the Fang, et al. cell. In such an embodiment, the control gate is replaced with a diffusion region. The control gate can be switched between 0 volts and $V_{cc}$ to select and de-select the cell during the read period and between $V_{jb}$ and 0 volts to program and erase the cells as set forth above. A select transistor is added at the source side to enable a fast read of the memory cell. In this operation, the gate of the added select transistor is set at less than or equal to zero volts during program and erasing and at $V_{cc}$ with $V_d$ less than or equal to $V_{cc}$ and $V_{dm}$ 0 volts via turning on the memory cell for the read period. ($V_d$ is the drain voltage for the select transistor and $V_{dm}$ is the drain voltage for the memory transistor). The bias configurations for the single poly memory cell are disclosed in FIG. 4B.

Generally, arrays of such individual memory cells are formed on a single substrate and combined with sense and read circuitry, and coupled by row-wise and column-wise conductive regions or metallic conductors to allow for array wide bulk program and erase as well as selected bit programming.

Each of the aforementioned configurations presents advantages and disadvantages in use in particular applications. Nevertheless, improvements in both the structure of individual cells and the manner in which they are connected together will result in more reliable, stable, faster, and lower power devices which can be programmed and erased at lower voltages. It should be noted that all of the above described cells incorporate the program and erase elements as part of the read path, and therefore the structures require tradeoffs between the program/erase operations and the read operation.

SUMMARY OF THE INVENTION

A non-volatile memory cell structure includes a floating gate, a reverse breakdown element for the injection of electrons or holes, and a sense transistor. The reverse breakdown injection element is at least partially formed in a first portion of a semiconductor substrate and covered by a portion of the floating gate. The sense transistor is at least partially formed in a second portion of a semiconductor substrate, isolated from the first region, and covered by a portion of the floating gate. A read transistor may be connected to the sense transistor. In one embodiment, the read transistor is at least partially formed in the second region of a semiconductor substrate, and connected to the sense transistor In a further embodiment, the electron injection element is separated from the hole injection element by a first channel region, and a portion of the floating gate is positioned over said first channel region. The resulting structure resembles a transistor with a source, drain and gate although it is possible that the source and drain are formed differently.

In a further unique embodiment of the invention, a channel implant region is formed in the channel region of the injection element to specifically tailor the reverse breakdown voltage of the electron or hole injection elements independent of the sense transistor.

Still further, the invention provides for differing thicknesses between oxide layers formed between the portions of the floating gate overlying the injection element, the sense transistor and any coupling element, and allows an oxide layer provided for a read transistor to be significantly thinner than any of the above oxides which are known in the prior art cells.

Various embodiments of electron or hole injection elements may be utilized within the scope of the present invention. The first source region may be a lightly doped impurity region and said first drain a heavily doped impurity region. Optionally, at least one individual region formed by an impurity of an opposite conductivity type to that of the first source and first drain regions may be provided adjacent said source and/or drain region. Still further, at least one contiguous region may be provided adjacent both said source region and said drain region. In addition, a well region of a second conductivity type, opposite to the substrate, may be formed in the substrate, the first source and first drain regions are formed by an impurity of the first conductivity type, and said well region is connected to a reference voltage.

The invention provides an improved non-volatile memory cell structure in which the elements may be easily individually tailored for specific applications and wherein the programming elements are isolated from the read elements.

BRIEF DESCRIPTION OF THE DRAWINGS

The invention will be described with respect to the particular embodiments thereof. Other objects, features, and advantages of the invention will become apparent with reference to the specification and drawings in which:

FIG. 4B is a table showing the voltages utilized in accordance with the single poly memory cell shown in FIG. 4A.

DETAILED DESCRIPTION

In one aspect, the invention comprises a novel EEPROM cell structure and arrangement for coupling the cell structure. In the present invention, the electron and hole injection element is provided in a manner where the element is positioned outside the read path of the nonvolatile memory cell of the present invention.

In the present invention, individual memory cells having a structure as set forth in the present detailed description and the accompanying Figures, or cells having a structure equivalent to or similar to that set forth in Ranaweera, et al. and/or co-pending U.S. patent application Ser. No. 08/871, 589 to Hao Fang, et al., or those set forth in U.S. Pat. No. 5,491,657, each of the foregoing disclosures being hereby specifically incorporated herein by reference, may be utilized in a novel cell structure, including a sense transistor, injector element, and coupling element, yielding a superior cell to those shown in the prior art.

In the following description, numerous details, for example specific materials process steps, etc., are set forth in order to provide a thorough understanding of the invention. It will be readily understood, however, to one of average skill in the art that specific details need not be employed to practice the present invention. Moreover, specific details of particular processes or structures may not be specifically presented in order to not unduly obscure the invention where such details would be readily apparent to one of average skill in the art. Those having ordinary skill in the art and access to the teachings described herein will recognize additional modifications and applications and embodiments within the scope of the present invention.

The avalanche/Zener breakdown elements disclosed herein generally include two active regions separated by a channel region, resembling a transistor with a source drain and gate. However, it should be understood that the use of such terms with respect to the avalanche/Zener elements disclosed herein as "source" and "drain" is only for convenience.

A First Avalanche/Zener Breakdown Cell

Figure 1B:
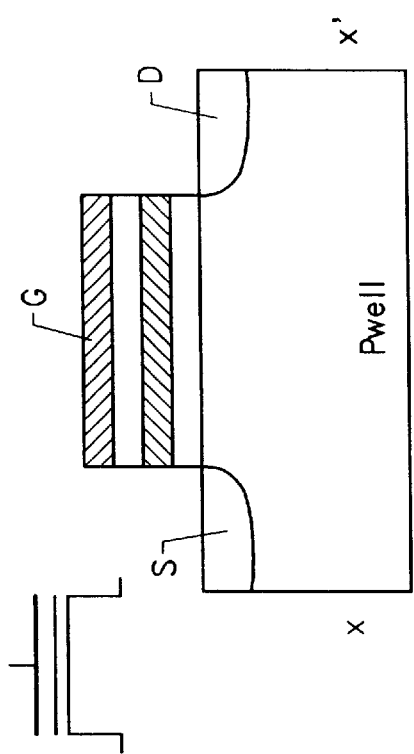
FIGS. 1B and 1C are cross-sections of a prior art reverse breakdown cell, and the Zener breakdown cell shown in FIG. 1A, respectively.
Figure 1C:
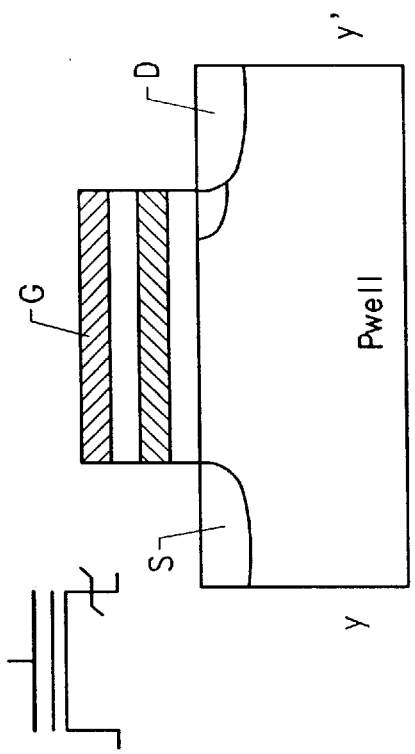
Figure 1A:
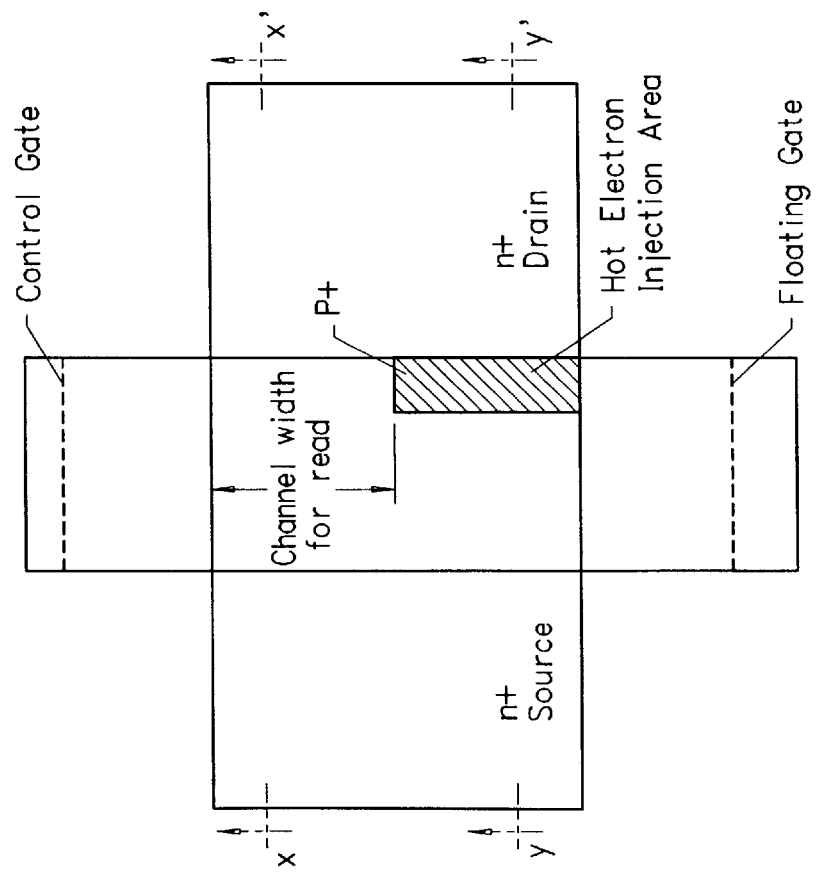
FIG. 1A is a plan view of a Zener breakdown based flash EEPROM cell.
Figure 2A:
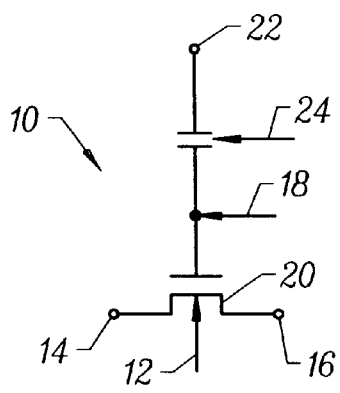
FIG. 2A is a schematic diagram of the non-volatile memory cell of the prior art.
Figure 2B:
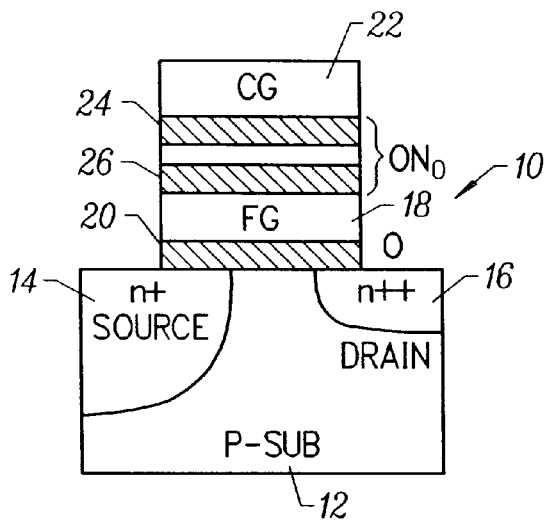
FIG. 2B shows a cross-sectional view of a non-volatile memory cell in accordance with the prior art.
Figure 3A:
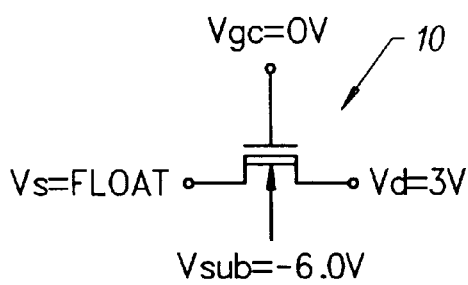
FIGS. 3A and 3B, respectively, show avalanche program and erase bias configurations of a memory cell in accordance with the prior art.
Figure 3B:
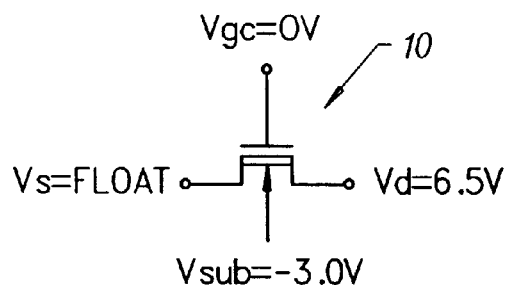
Figure 4A:
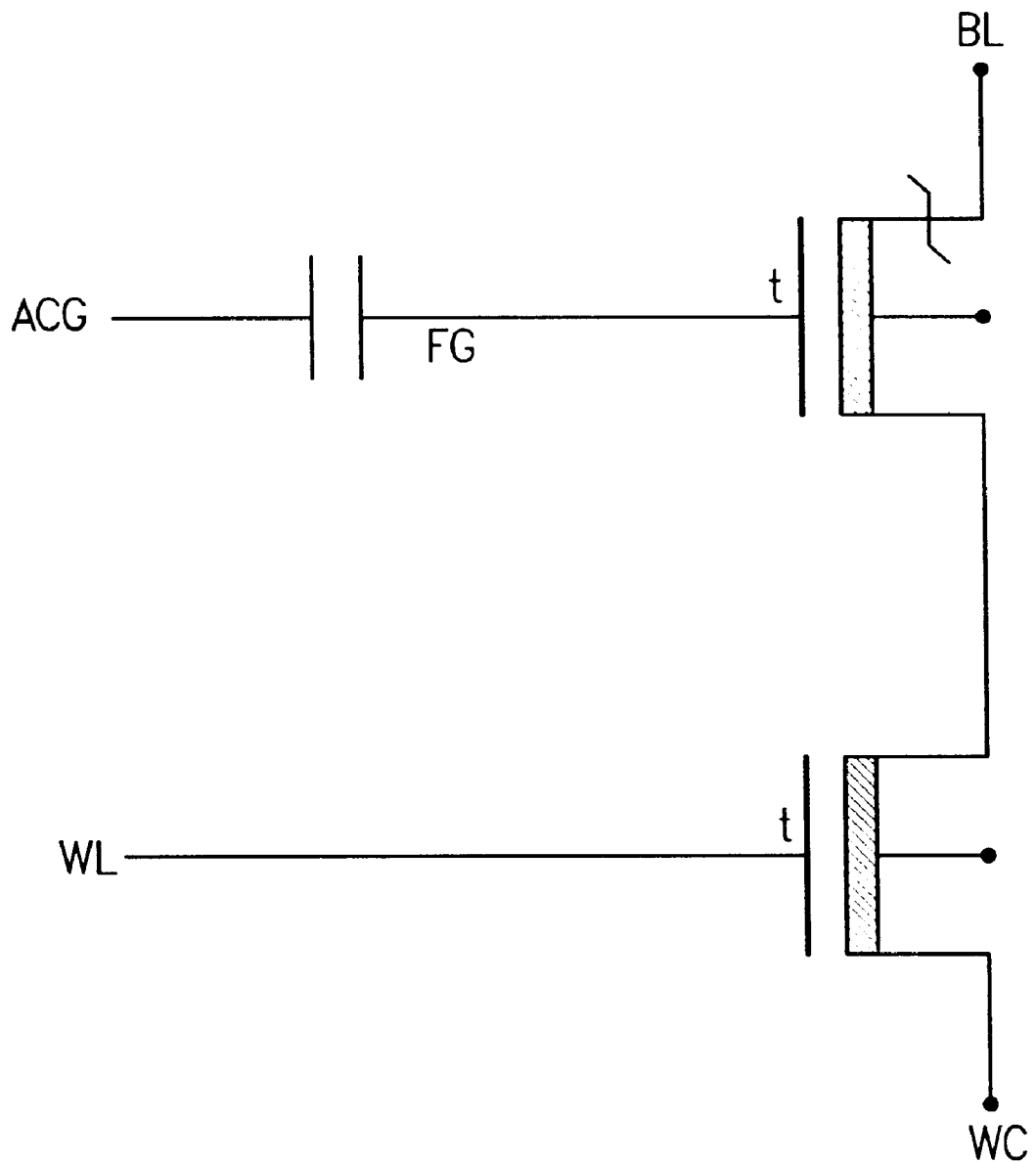
FIG. 4A is a schematic diagram of a single poly memory cell in accordance with the prior art.
Figure 5:
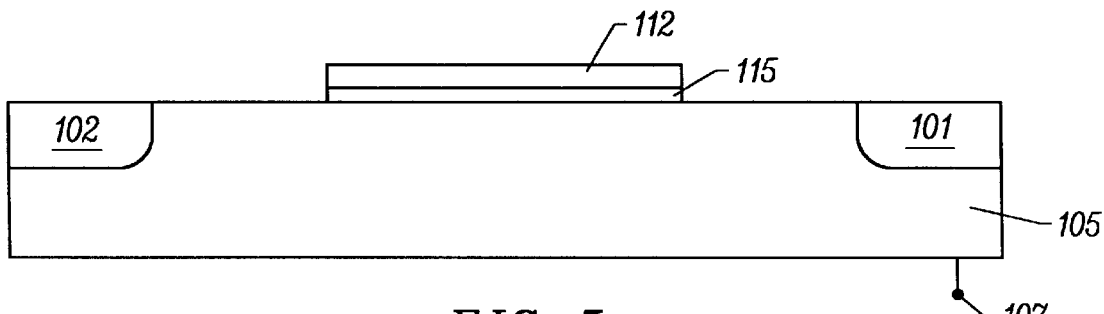
FIGS. 5–7 are cross-sections of a semi-conductor substrate and a non-volatile memory cell formed in accordance with the present invention.
Figure 6:
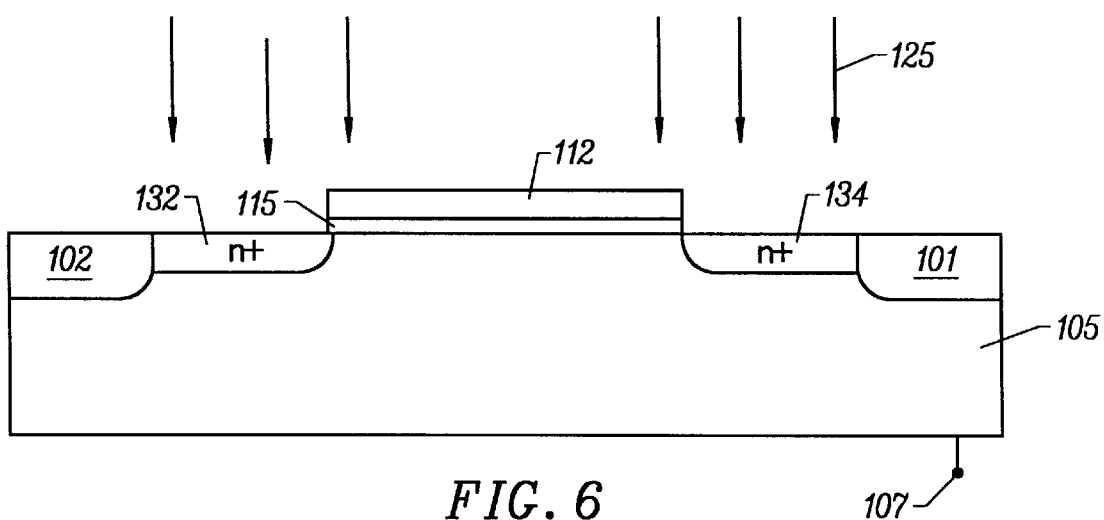
Figure 7:
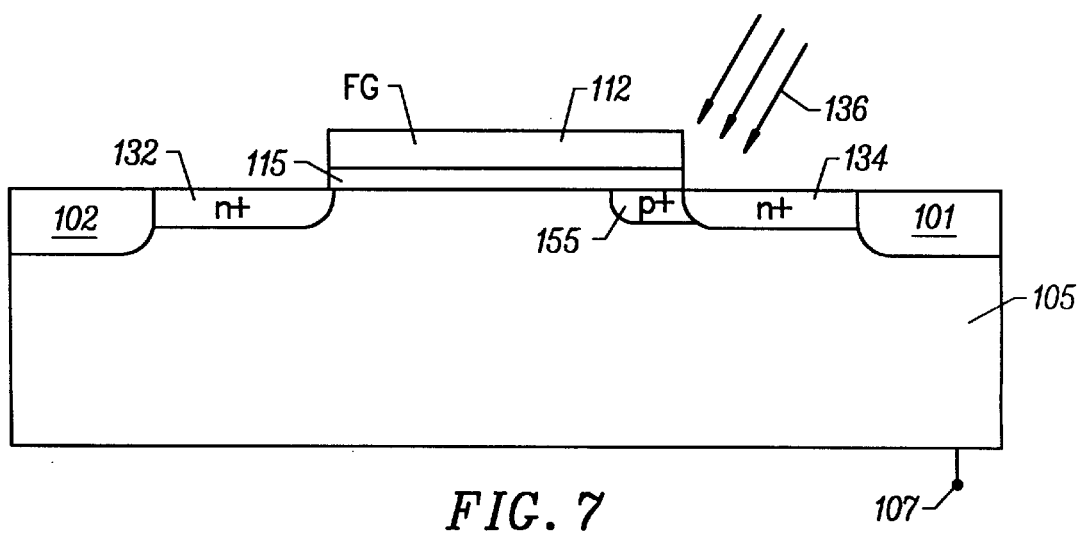

A first non-volatile memory cell structure and a method for manufacturing the structure are shown and described with respect to FIGS. 5–7. FIGS. 5–7 show an exemplary series of steps in the formation of a first embodiment of an avalanche/Zener gate structure suitable for use with the nonvolatile technologies disclosed herein.

FIG. 5 shows a substrate 105 having formed -therein field oxidation regions 101 and 102, a gate oxide 115, and a floating gate 112, provided on the gate oxide 115. In one embodiment, substrate 105 may be a P-type substrate having a background doping concentration of about $1e^{15}$–$1e^{17}$ atm/cm3. Field oxidation regions 101 and 102 represent device isolation structures formed in accordance with well known techniques such as LOCOS, trench isolation, shallow trench isolation and various equivalent alternatives. The shape of the isolation depicted in the Figures of the present disclosure is not intended to limit the nature of the type of isolation used herein.

Gate oxide 115 and floating gate 112 are formed in accordance with conventional techniques by, for example, forming a thermal oxide on the surface of substrate 105, depositing a polysilicon layer on top of the gate oxide, and etching the gate oxide and polysilicon layers to form a gate stack comprising oxide 115 and floating gate 112. Various alternative parameters are suitable for growing the gate oxide layer and are well within the knowledge of one of average skill in the art. Likewise, numerous techniques for forming the floating gate layer may be used, including, but not limited to depositing polysilicon by chemical vapor deposition or sputtering and annealing techniques well known to one of average skill in the art. Etching of the polysilicon and gate oxide layers may be performed by any number of suitable wet or dry directional etch step in accordance with well known techniques.

Subsequent to formation of the gate stack, an impurity implant 125 of a dopant having a conductivity type opposite to that of the substrate (arsenic or phosphorus, for example) is performed to form self-aligned impurity regions 132,134 and P-type substrate 105. Typical junction depths of 0.1 $\mu$m to 0.5 $\mu$m and doping concentration of about $5 \times 10^{18}$ to $1 \times 10^{21}$ $cm^{-3}$ are suitable. Substrate 105 may optionally have a connection 107 to allow for biasing the substrate.

Following implantation of the impurity regions 132,134, a Large Angle Tilt Implant (LATI) is utilized to form a P+ region 155 adjacent to region 134. The P+ implant extends a portion of the width of the channel region, from a position adjacent to region 134 and reduces the breakdown voltage. The implant angle, energy, and dose may be set in order to optimize the generation of hot electrons for program or hot holes for erase. Typically an implant of boron at an energy of 30 to 200 KeV, to a depth as great as 0.1 to 0.4 $\mu$m in a concentration of about $1 \times 10^{18}$ to $1 \times 10^{20}$ $cm^{-3}$ can be used.

Such a configuration provides the ability to utilize reverse breakdown voltages in a range of 3V to 10V in order to generate energetic hot carriers independent of the channel length of the device. It should be recognized with reference to Ranaweera, et al., that the breakdown characteristics of the various P+ N+ junctions varies with the concentration of the P+ region. Furthermore, it can be recognized that the P+N+ profile can be optimized for either injecting hot electrons or hot holes.

An alternate method of supplying the P+ doping region 155 that controls the location and value of the breakdown in the channel is to preform an impurity implant of the same type as that of the substrate before the formation of the gate stack in FIG. 5. Subsequent processes as in FIG. 5 and FIG. 6 can produce N+ to P+ lateral junction doping profiles similar to those in FIG. 7. The method of formation of the lateral junction doping profile, and the portion of the channel width used for constructing that profile has no effect on the read performance of the cell since the breakdown occurs in an element that is not a part of the read path.

It will be recognized that the method of the present invention of an avalanche/Zener floating gate device adds significant flexibility since the read path and programing elements can be independently optimized as opposed to the elementary teachings provided in Ranaweera, et al. In the present invention, the channel implant in a programming device outside the read path allows for a great degree of freedom both in the placement of the implant, the dopant concentration, and the junction depth of the implant in the cell structure shown in FIG. 7.

Exemplary operational characteristics for the device shown in FIG. 7 are given as follows: To add electrons to floating gate FG, the substrate is biased to 0V, region 132 is floating, region 134 is at a positive voltage, larger than junction breakdown, such as 6V and the FG is coupled to a high positive voltage, such as 6V, from, for example, biasing a control gate (not shown). To remove electrons from FG (e.g. add holes), the substrate is biased to 0V, region 132 is floating, region 134 is at 8V and the FG is coupled to a low voltage near 0V by, for example, biasing the control gate to 0V or to a negative voltage. It should be understood that either adding electrons, or removing electrons (or adding holes) can constitute a "program" or "erase" operation, as such "program" or "erase" operation is defined by the context of the overall device in which the non-volatile memory cell is used.

It should be recognized that the method and cell described with reference to FIG. 5–7 may be utilized with any number of connections in any number of matrix arrangements shown herein or in the prior art. It should be further recognized that the method of the present invention may be utilized to construct a non-volatile device wherein the operating parameters vary from the exemplary embodiment set forth above.

In this aspect, the method of forming a memory cell improves substantially over prior art conventional techniques which are taught as being used in Ranaweera et al. In particular, the depth and concentration of the implant can be tailored to the particular device before or after formation of the gate stack, thereby simplifying device manufacture by eliminating at least the spacer formation steps particularly detailed in Ranaweera, et al. as necessary to prevent counter-doping the P+ region when implanting the source and drain regions.

A Second, Double-Sided Pocket Implant EEPROM Cell

Figure 8A:
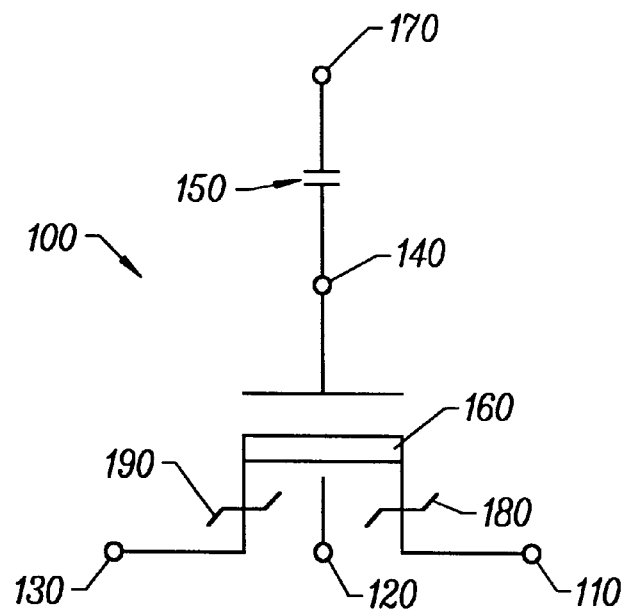
FIG. 8A is a schematic diagram of a further embodiment of a non-volatile memory cell structure of the present invention.
Figure 8B:
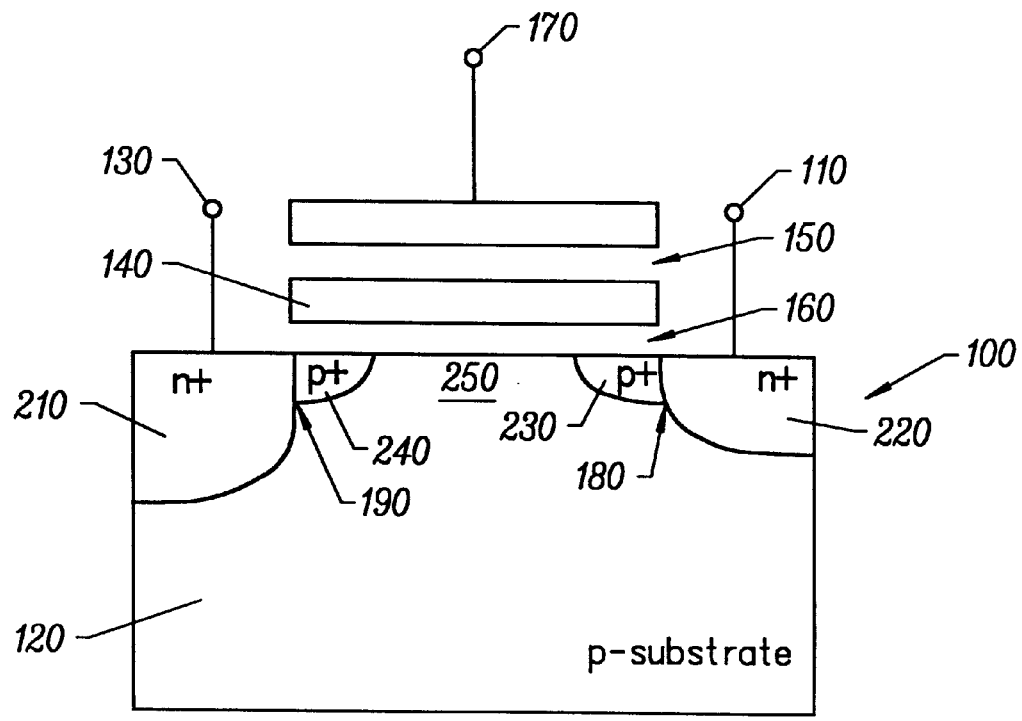
FIG. 8B is a cross-section of the embodiment of a non-volatile memory cell of FIG. 8A.

Another EEPROM cell suitable for use in accordance with the present invention is shown in FIGS. 8A and 8B.

In this aspect, the nonvolatile memory cell is programmed and erased using hot carriers/holes generated by Zener/avalanche breakdown over different regions of the cell oxide. FIG. 8A is a schematic diagram of a memory cell 100 according to this aspect of the invention. It will be recognized that although the following description describes formation in a P-type substrate, formation in an N-well is likewise contemplated.

In cell 100, hot carriers generated by Zener/avalanche breakdown are employed to program and erase memory cell 100. Memory cell 100 is erased by reverse biasing the $P^+ N^+$ junction 180 formed by P+ region 230 and $N^+$ region 220. $P^+ N^+$ junction 180 is reverse biased by applying, for example, 8V to region 110 and 0V to substrate 120. In addition, a potential of, for example, 8V, is coupled to the floating gate FG by a control gate 170 which becomes greater than that of substrate 120, and hot electrons generated in breakdown mode are then "injected" into floating gate 140 through oxide layer 160. The resulting net negative voltage on floating gate 140 erases memory cell 100.

Memory cell 100 is programmed by reverse biasing the $P^+$ $N^+$ junction 190 formed by $P^+$ region 240 and $N^+$ region 210. $P^+ N^+$ junction 190 is reverse biased by applying 8V to implant region 130 and 0V to substrate 120. A low or zero voltage is coupled to the floating gate by a control gate so that hot holes are injected through oxide layer 160. The resulting net positive voltage on floating gate 140 programs memory cell 100.

Cell 100 minimizes this surface damage attributable to repeated injections of hot carriers into the floating gate 140, by programming (i.e., inject hot holes) and erasing (i.e., inject hot electrons) through two different areas of the oxide layer 160. In so doing, the memory cell 100 according to the present invention increases long-term cell reliability and enhances data retention. Note that the P+ N+ doping profile of the electron injector can be different from the P+ N+ doping profile of the hole injector.

The Non-Volatile Cell Structure Positioned Outside the Read Path

As discussed herein, non-volatile memory cells are typically utilized with accompanying circuitry in cell structures. Such circuitry includes means for controlling voltages applied to the respective terminals of the floating gate device, and for reading the state of the device after it is programmed.

In accordance with the present invention, FIGS. 9–12 show various embodiments of avalanche/Zener floating gate devices coupled in EEPROM cell structures which include accompanying control circuitry. In a unique feature of this aspect of the present invention, the reverse breakdown, hot carrier injection element is provided outside the read path of the cell structure, thereby allowing greater control of the characteristics of the non-volatile memory device during manufacture.

Figure 9:
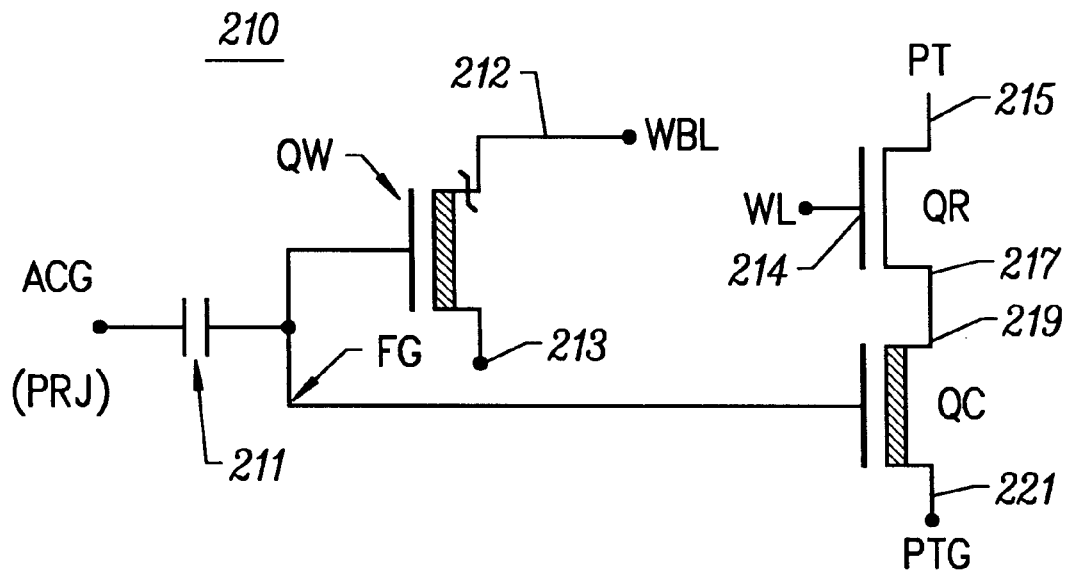
FIG. 9 is a schematic diagram of a memory cell constructed in accordance with one embodiment of the present invention.
Figure 10:
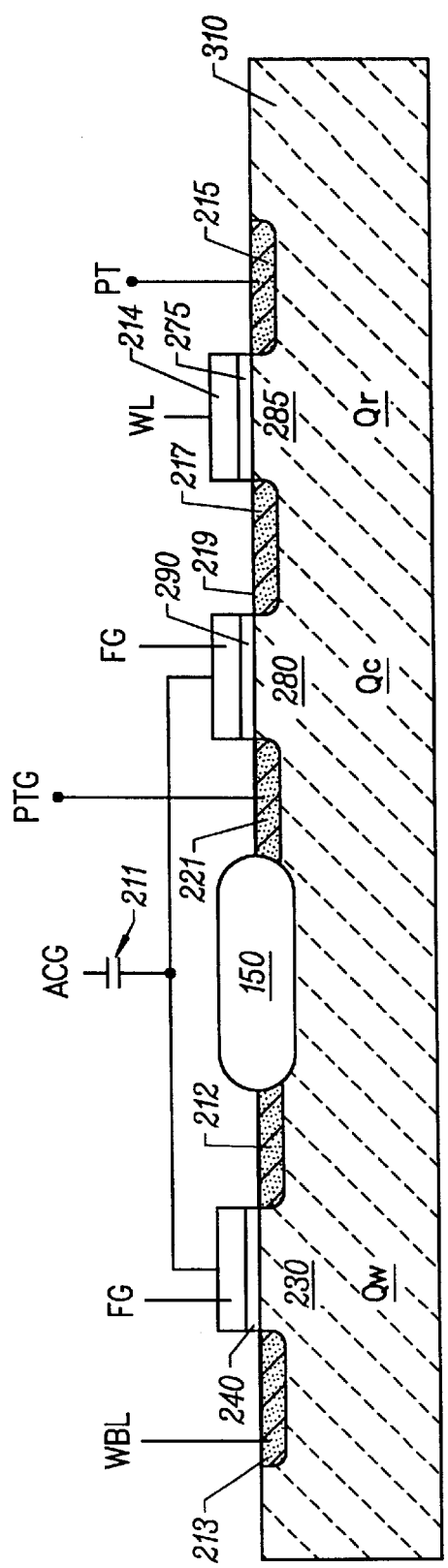
FIG. 10 is a cross-sectional diagram of an memory cell suitable for us with the embodiment of FIG. 9.

FIG. 9 shows a schematic diagram of a first embodiment of a nonvolatile memory cell structure 210 formed in accordance with one aspect of the present invention. FIG. 10 is a cross section of a first embodiment of the EEPROM cell structure of FIG. 9.

Structure 210 includes an (array) control gate ACG, floating gate FG, avalanche/Zener program element $Q_w$, a read transistor $Q_r$, and a sense transistor $Q_c$. The control gate ACG is used to accelerate electrons or holes selectively to or from the floating gate by capacitively coupling a field across the oxide that separates the avalanche element from the floating gate.

As shown in FIGS. 9 and 10, sense transistor $Q_c$ and avalanche element $Q_w$ share floating gate FG. Floating gate FG is capacitively coupled to array control gate (ACG) voltage via capacitor 211. Avalanche/Zener program element $Q_w$ shares floating gate FG with sense transistor $Q_c$, and includes a first active region 212 and second active region 213.

Sense transistor $Q_c$ shares its drain 219 with source 217 of read transistor $Q_r$. Gate 214 of read transistor $Q_r$ is connected to word line WL. The drain of read transistor $Q_r$ is connected to a read signal select (product term) PT, while the source of sense transistor $Q_c$ is connected to sense signal (product term gate) PTG.

It should be recognized that avalanche/Zener element $Q_w$ can have a structure similar to that set forth in Ranaweera, et al., and/or co-pending U.S. patent application Ser. No. 08/871,589 by Hao Fang, et al. or those set forth in U.S. Pat. No. 4,491,657, or those embodiments set forth herein above in addition to a number of other methods of forming junctions.

FIG. 10 shows an exemplary cross-section of the embodiment of the EEPROM cell 210 as formed on a semiconductor substrate 310. Silicon substrate 310 has a first conductivity type such as a P-type conductivity. The EEPROM cell 210 has three separate elements formed in the semiconductor substrate 310, namely, an avalanche/Zener element $Q_w$, a sense transistor $Q_c$ and a read transistor $Q_r$. An avalanche/Zener element $Q_w$ is electrically separated from the sense transistor $Q_c$ by a first insulated region 150, e.g. silicon dioxide, also formed in the semiconductor substrate 310.

Avalanche/Zener element $Q_w$ has first impurity region 213 and a second impurity region 212, all formed within a substrate 310 with a channel 230 positioned there between. Overlying the channel 230 is an oxide layer 240. The oxide layer 240 is typically composed of an insulating material, such as silicon dioxide, and has a thickness of approximately 60 to 160 angstroms. Oxide layer 240 may be deposited or grown (using conventional oxide deposition techniques) in a single process step.

Sense transistor $Q_c$ has a source 221 and a drain 219 formed in the semiconductor substrate 310. A sense channel 280 is formed between source 221 and drain 219. The conductivity of the source 221 and the drain 219 is of the second conductivity type, for example, an N+ conductivity type. Overlying the channel 280 is an oxide layer 290 having an approximate thickness of 60 to 160 angstroms. As earlier described, the sense tunnel oxide layer 290 may also be simultaneously formed with the oxide layer 240. Depending on the mode of sense transistor $Q_c$ (depletion or enhancement mode), the relevant voltages for operating the EEPROM cell 210 are adjusted. The sense transistor $Q_c$ is, in one embodiment, a depletion mode transistor, as is commonly understood in the industry. In a further embodiment, the sense transistor $Q_c$ is an enhancement mode transistor (also as commonly known in the industry).

The read transistor $Q_r$ shares diffusion region 219 with the sense transistor $Q_c$; hence diffusion region 219 acts as the read transistor source and sense transistor drain. The read transistor Qr also has a drain 215 that has the second conductivity type, e.g. an N+ conductivity type. A channel 285 is positioned between source 217 and drain 215. Overlying the read channel is an oxide 275 layer that is composed of an insulating material, such a silicon dioxide, and has an approximate thickness of 25–150 angstroms. The read drain oxide layer 275 may be formed in the same step as the oxide layer 290, or in a separate step. Between the read source 217 and the read drain 215 is a read channel 285. A read gate 214 overlies the read oxide layer 275 and is composed of a conducting material, such as a polycrystalline silicon material.

Floating gate FG overlies the program element oxide layer 240 and sense oxide layer 290. Floating gate FG is also formed of a conducting material, such as a polycrystalline silicon material.

Figure 11:
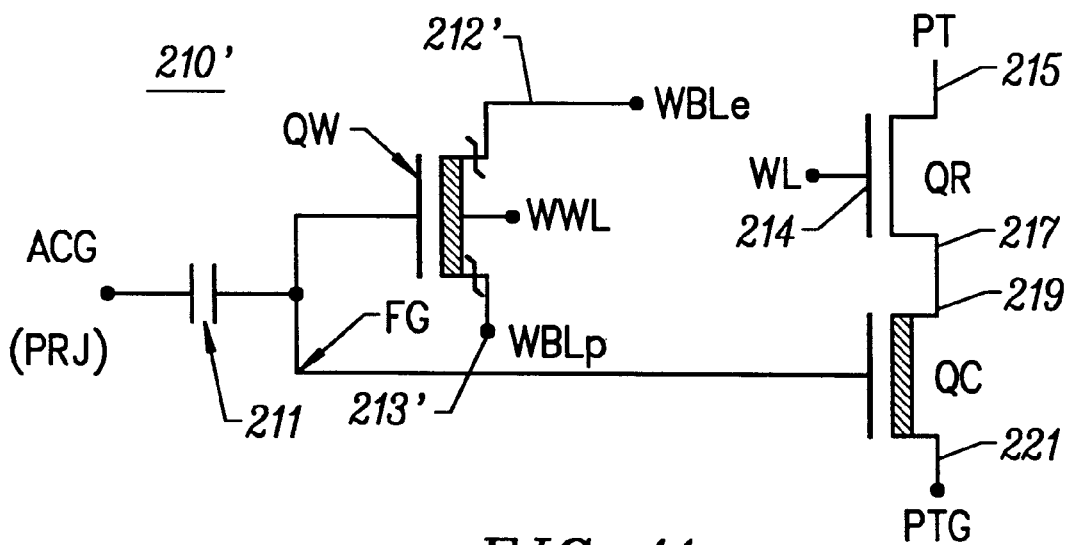
FIG. 11 is a schematic diagram of a memory cell constructed in accordance with a second embodiment of the present invention.
Figure 12:
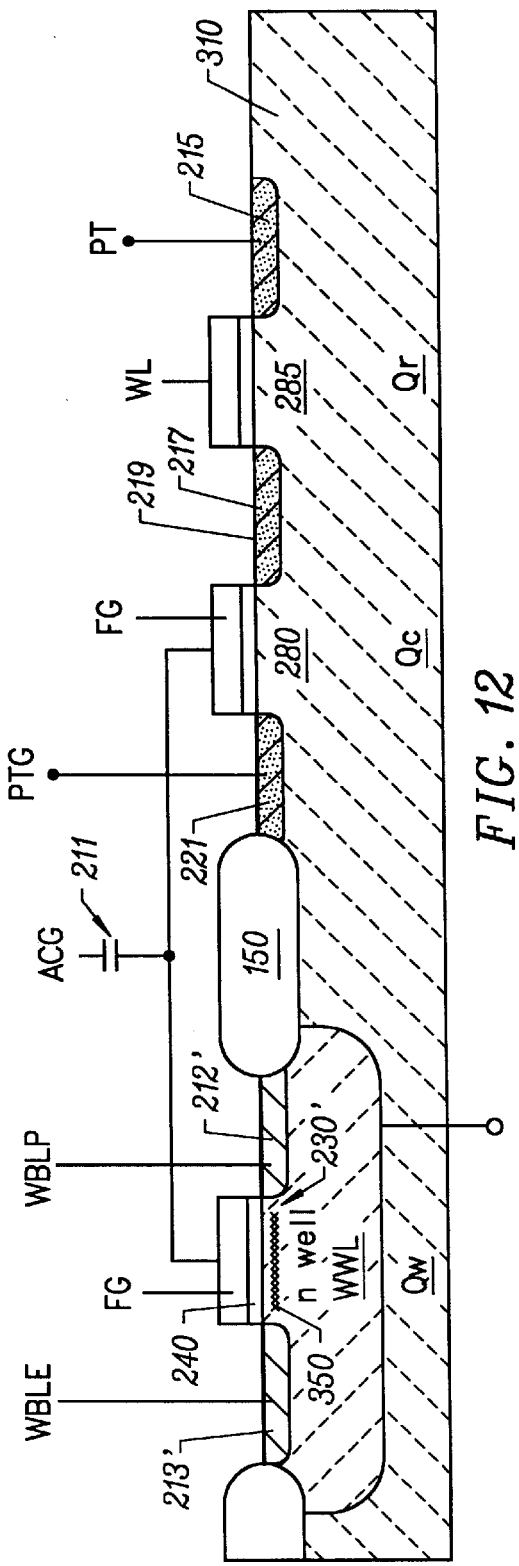
FIG. 12 is a cross-sectional diagram of an memory cell suitable for us with the embodiment of FIG. 10.

FIGS. 11 and 12 are a schematic diagram and a cross section, respectively, of an alternative embodiment of the invention set forth above with respect to FIGS. 9 and 10. In this embodiment, a dual side (program/erase) program transistor $Q_w'$ is utilized and is formed in an n well region in substrate 310 in order to allow for easier coupling-of devices in the array and provide an alternative mechanism for charging and discharging the floating gate FG.

As shown in FIG. 12, well 380 has a second conductivity type opposite the first conductivity type, such as an N conductivity type. In contrast, the impurity regions 213' and 212' have the first conductivity type, e.g. a P type conductivity. An N+ region in well 380 provides appropriate electrical contact to metal lines in the EEPROM cell 210, such as word write line (WWL).

Also illustrated in FIG. 12 is a further unique aspect of the present invention enabled by the configuration set forth in FIGS. 9–12, that of a selective channel implant region 350 implanted in channel 230' which allows one to tailor the reverse breakdown voltage of the cell to suit the particular application of the EEPROM 210.

The elements $Q_w$, $Q_c$ and $Q_r$ of EEPROM 210 are electrically coupled to certain electrical lines and gates in order to operate and control the functions of the EEPROM cell 210. As shown in FIG. 12, $WBL_e$ is electrically coupled to the program region 213, $WBL_p$ coupled to region 212, and WWL to N+ well 380. Both configurations (210, 210') share an additional capacitor 211 used to capacitively couple voltage (ACG) onto the floating gate (FG). An array control gate (ACG) is capacitively coupled to the floating gate FG. A product term gate (PTG) is electrically coupled to the sense source 221 of the sense transistor $Q_c$. A word line read (WL) is electrically coupled to the read gate 214 of the read transistor Qr and a Product Term (PT) is electrically coupled to the read drain 215. A significant advantage of the N-well configuration shown in FIG. 12 is the isolation of cell $Q_w$ with respect to other cells in an array. Normally, tight control over programming voltages must be maintained in order to avoid program disturb. Isolation of each program element in an N-well reduces the need for this tight control due to the respective isolation of each cell.

Typical operating voltages for the foregoing lines are given in Table 1:

TABLE 1

|  | WBL | WWL | ACG | PT | PTG | WL |
|---|---|---|---|---|---|---|
| Erase (NMOS) | 6v | 0v | 8v | Float | 6v | Vcc |
| Program (NMOS) | 6v | 0v | 0v | Float | 0v | 0V |
| Erase (PMCS) | 0v | 6v | 8v | Float | 6v | Vcc |
| Program (PMOS) | 0v | 6v | 0v | Float | 0v | 0V |

In contrast with the cell disclosed in U.S. Pat. No. 4,924,278, the cell of the present invention utilizes the avalanche/Zener injection capacities of the aforementioned prior art to place electrons or holes on the floating gate in accordance with the techniques described therein.

Because of the separate formations for each of the elements, the diode doping gradient for transistor $Q_w$ can be selected to control the avalanche breakdown voltage of cell $Q_w$ and a scaling of the programming voltage below current known levels.

In a further unique aspect of the present invention, the reduction in program voltage allows a reduction in oxide thickness for all floating gate elements. Separation of the read path and program elements in accordance with this aspect of the present invention further allows one to use differing oxides for the read and sense elements.

In the devices shown in FIGS. 11–12, separate program and erase path are utilized, hence a source region is for example connected to a write enable line ($WBL_e$) while the source region is connected to the program enable line ($WBL_p$). It should be recognized that the separate program and erase paths shown in FIGS. 11–12 are not required for the present invention, but the employment of this "back-to-back" diode provides advantages in separating the program and erase operations.

It should be recognized that transistor $Q_w$' could also be formed in an NMOS embodiment, and transistor Qw in a PMOS embodiment, without diverging from the scope of the present invention. Moreover, numerous conventional fabrication methods are suitable for adjusting the diode doping gradient of the channel region 350.

AN EEPROM Array and Method for Programming

As noted above, cells of the type presented herein are typically provided in an array in which a number of cells are coupled to control conductors in the form of metal or diffused regions in the substrate. Control voltages are applied to these conductors in order to accomplish the goals of the integrated circuit device of which the array is a part.

Figure 13:
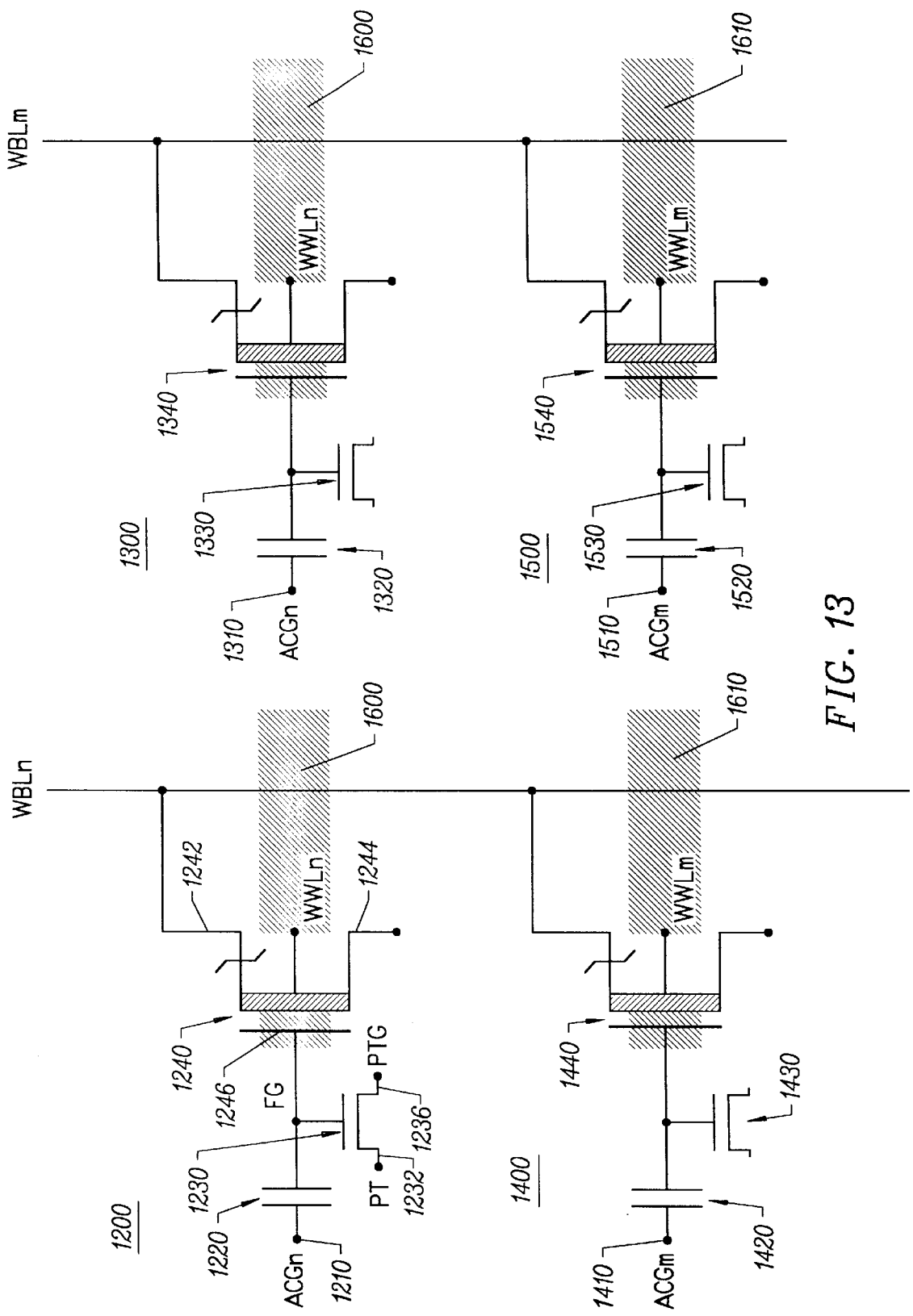
FIG. 13 is a schematic diagram of a 2×2 matrix of memory cells in accordance with the present invention.

An example of one such array structure is shown in FIG. 13. FIG. 13 shows a two-by-two matrix 1000 of non-volatile memory cells 1200,1300,1400,1500 in accordance with the present invention. Cell 1200 is exemplary of each cell in the matrix and hence the structure of cells 1300, 1400 and 1500 is not specifically described, but should be readily understood by reference to like designated components designated with reference numerals (13xx,14xx,15xx) similar to those in cell 1200 (12xx). Cells 1200,1300,1400,1500 are hereinafter described with reference to their formation as NMOS transistors in a p-doped substrate. Alternative embodiments of PMOS transistors in aptly formed well regions in the substrate will be readily apparent to one of average skill in the art.

Cell 1200 includes capacitor 1220, a floating gate transistor 1230, and an avalanche/Zener injector element 1240. It will be understood that element 1240 (as well as elements 1340,1440,1540) can have a configuration equivalent to the avalanche/Zener-type nonvolatile memory cells disclosed as set forth herein in the preceding sections, or those discussed in Fang, et al., Haddad, et al., or Ranaweera, et al.

Element 1240 includes a drain region 1242 coupled to a first program line ($WBL)_n$ and a source region 1244, and floating gate (FG) at region 1246. Nonvolatile floating gate transistor 1230 includes a source 1232 and drain 1236, and floating gate (FG) coupled at point 1234. Floating gate (FG) is coupled in common with the control gate capacitor 1220. Transistor 1230 provides the sense element for circuitry (such as read circuitry, not shown) which is utilized in detecting the state of the cell. The source and drain of transistor 1230 may be coupled to read circuitry and electrical couplings as discussed above, or in any number of other well-known manners.

Cells 1200 and 300 share a first common array control gate (ACG) connection $ACG_n$ at terminals 1210, 1310, coupled to capacitors 1220, 1320, respectively. Likewise, each avalanche injector diode 1240, 1340, in a novel aspect of the present invention, shares a first common Word Line Connector $WWL_n$.

It will be readily recognized that the particular construction of the avalanche cells, and the construction of the floating gate transistors, may be varied in accordance with the principles of the present invention.

In one exemplary application of the voltages applied on the respective conductors in accordance with the present invention, only one cell in the array, in this case cell 1200, will have an avalanche injector diode which is in breakdown mode, while each of the other cells will not be in breakdown mode assuming a breakdown state of 6V, where six volts are above the avalanche breakdown mode, while three volts are below. Hence, in one embodiment, gated elements 1240, 1340, 1440, 1540 are only in avalanche breakdown mode when WBL equals six and WWL equals zero on an individual cell. The selected cell (1200 in this example) may be charged to $+V_e$ or $-V_p$ (and hence erased or programmed) according to the bias on the ACG. Cells 1300 and 1400 have an applied voltage of only 3 volts and hence are not in avalanche mode. Cell 1500 has zero volts on both $WWL_m$ and $WBL_m$ and hence there is zero voltage across the breakdown region.

It should be understood that any number of cells may be utilized in accordance with the teachings of the present invention.

The many features and advantages of the present invention will be apparent to one of average skill in the art in view of the illustrative embodiments set forth herein. The present invention has been described herein with respect to particular embodiments for a particular applications. It will be apparent to one of average skill in the art that numerous modifications and adaptations of the present invention may be made in accordance with the invention without departing from the spirit of the scope of the invention as disclosed herein and defined by the following claims.

What is claimed is:

1. A non-volatile memory cell structure, comprising:
   a floating gate;
   a reverse breakdown injection element at least partially formed in a first portion of a semiconductor substrate and under at least a first portion of the floating gate; and
   a sense transistor at least partially formed in a second portion of the semiconductor substrate isolated from the first portion of the substrate, and under at least a second portion of the floating gate.

2. The structure as defined in claim 1 further comprising:
   a control gate, capacitively coupled to said floating gate.

3. The structure as defined in claim 2 further comprising:
a read transistor at least partially formed in the second portion of a semiconductor substrate, connected to the sense transistor.

4. The structure as defined in claim 3 wherein at least one contiguous region formed by an impurity of an opposite conductivity type to that of said first or second active regions is provided adjacent said first or second active region.

5. The structure as defined in claim 4 wherein at least one said contiguous region is provided adjacent each of said first active region and said second active region.

6. The structure as defined in claim 3 wherein the substrate has a doping concentration of a first conductivity type, and said structure further includes a channel doping in said first channel region, the implant being of the same impurity type as said substrate.

7. The structure as defined in claim 3 wherein:
the substrate has a doping concentration of a first conductivity type;
a well region of a second conductivity type is formed in the first portion of the substrate;
the first and second active regions comprise a source region and a drain region, respectively, formed by an impurity of said first conductivity type;
wherein said well region is operatively coupled to a control voltage; and
wherein said structure further includes a channel doping in said first channel region, the implant being of the same impurity type-as said well.

8. The structure as defined in claim 3 wherein
the substrate has a doping concentration of a first conductivity type;
a well region of a second conductivity type is formed in the first region of the substrate;
the first active and second active regions are formed by an impurity of said first conductivity type; and
said well region is connected to a control voltage.

9. The structure as defined in claim 2 wherein the reverse breakdown injection element comprises a first and second active regions separated by a first channel region, all formed in the first portion of the semiconductor substrate, and said floating gate is positioned over said first channel region.

10. The structure as defined in claim 9 wherein the sense transistor comprises a third and fourth active regions separated by a second channel region, all formed in the second portion of the semiconductor substrate, and said floating gate is positioned over said second channel region.

11. The structure as defined in claim 10 wherein the read transistor comprises said fourth and a fifth active regions separated by a third channel region, all formed in the second portion of the semiconductor substrate.

12. The structure as defined in claim 11 wherein a first gate oxide overlies said first channel region and a second gate oxide overlies said second channel region and a third gate oxide overlies said third channel region.

13. The structure as defined in claim 12 wherein the first and second gate oxides have a minimum thickness of about 60 Å to 160 Å.

14. The structure as defined in claim 12 wherein the third gate oxide has a thickness less than said first and second gate oxides and in a range of about 25 Å to 100 Å.

15. The structure as defined in claim 9 wherein the substrate has a background doping concentration of a first conductivity type;
a well region of a second conductivity type is formed in the first portion of the substrate;
the first and second active regions comprise a source region and a drain region, respectively, formed by an impurity of said first conductivity type; and
said well region is connected to a control voltage.

16. A non-volatile memory cell structure, comprising:
a semiconductor substrate having a surface;
a floating gate structure;
a reverse breakdown injection element including a first active region, a second active region, and a first gate oxide, operatively coupled to a first portion of the floating gate overlying the first gate oxide;
a sense transistor including a third active region, a fourth active region and a second gate oxide, separated from the first active region, second active region and first gate oxide by device isolation and operatively coupled to a second portion of the floating gate structure; and
a read transistor having a fifth active region, sharing said fourth active region as a source with the drain of said sense transistor, having a third gate oxide, and having a gate overlying the third gate oxide.

17. The structure as defined in claim 16 further comprising a control gate, capacitively coupled to said floating gate.

18. The structure as defined in claim 17 wherein the third gate oxide has a thickness less than the first gate oxide and in a range of about 25 to 100 Å.

19. The structure as defined in claim 17 wherein at least one contiguous region formed by an impurity of an opposite conductivity type to that of the first active region and second active region is provided adjacent said first or second active regions.

20. The structure as defined in claim 19 wherein at least one said contiguous region is provided adjacent each said first active region and said second active region.

21. The structure as defined in claim 17 wherein the substrate has a doping concentration of a first conductivity type, and said structure further includes a channel implant in said first channel region, the implant being of the same impurity type as said substrate.

22. The structure as defined in claim 17 wherein the substrate has a doping concentration of a first conductivity type;
a well region of a second conductivity type is formed in the first region of the substrate;
the first and active regions are formed by an impurity of said first conductivity type;
wherein said well region is connected to a control voltage; and
wherein said structure further includes a channel implant in said first channel region, the implant being of the same impurity type as said well.

23. The structure as defined in claim 22 wherein the gate oxide layer has a first thickness between the first portion of the floating gate and the first and second active regions of about 60 to 160 Å.

24. The structure as defined in claim 22 wherein the gate oxide layer has a second thickness thinner than the first thickness between the second portion of the floating gate and the source and drain regions of about 60 to 160 Å.

25. The structure as defined in claim 22 wherein at least one contiguous region formed by an impurity of an opposite conductivity type to that of the source and drain regions is provided adjacent said source or drain region.

26. The structure as defined in claim 22 wherein at least one said contiguous region is provided adjacent said first or second active regions.

27. The structure as defined in claim 22 wherein a well region of a second conductivity type is formed in the first region of the substrate;

the first source and first drain regions are formed by an impurity of said first conductivity type; and said well region is connected to a control voltage.

28. The structure as defined in claim 16 wherein the first gate oxide has a thickness of about 60 Å to 160 Å.

29. The structure as defined in claim 28 wherein the second gate oxide has said thickness of said first gate oxide.

30. The structure as defined in claim 28 wherein the second gate oxide has a different thickness than said first gate oxide and is in a range of about 60–160 Å.

31. An EEPROM structure, comprising:

a semiconductor substrate of a first conductivity type having a surface;

a first breakdown element including a first active region and second active region formed in the substrate adjacent to the surface of said substrate;

a second transistor and a third transistor, separated from said first breakdown element by device isolation, the second transistor having a source and a drain region, the third transistor sharing the source region of the second transistor as its drain region and having a source region; and a floating gate positioned adjacent to the surface and separated from said surface by a gate oxide layer, the floating gate having a first portion overlying the first breakdown element and at least a second portion overlying the transistor;

wherein the first element is constructed so that a reverse voltage breakdown condition generated at the first or second active regions adds electrons or holes to the floating gate when an appropriate voltage is applied to the gate.

32. The structure as defined in claim 31, further comprising a control gate capacitively coupled to said floating gate.

33. The structure as defined in claim 31 wherein the first and second active regions are separated by a first channel region, said first portion of said floating gate is positioned over said first channel region, and said channel region includes a channel implant.

34. A memory array comprising a plurality of memory cells, comprising:

a plurality array control gate voltage conductors;

a plurality of write bit line conductors;

a plurality of product term gate;

a plurality of word lines;

a plurality of product terms;

an array of memory cells, each cell comprising:
a control gate;
a floating gate capacitively coupled to the control gate;

a reverse breakdown hot carrier injection element at least partially formed in a first region of a semiconductor substrate and under at least a first portion of the floating gate, having a first active region connected to one of said write bit lines;

a sense transistor located under at least a second portion of the floating gate and at least partially formed in a second region of the semiconductor substrate isolated from the first region of the substrate, the sense transistor having a source region connected to one of said plurality of product term gates; and a read transistor at least partially formed in the second region of a semiconductor substrate, connected to the sense transistor, having a gate connected to one of said word lines and a drain connected to one of said plurality of product term lines.

* * * * *